United States Patent
Lee et al.

[11] Patent Number: 6,118,562
[45] Date of Patent: Sep. 12, 2000

[54] WAVELENGTH ALIGNING APPARATUS USING ARRAYED WAVEGUIDE GRATING

[75] Inventors: Hyun Jae Lee, Daejeon; Gap Youl Lyu, Kyunggi-do; Seo Yeon Park, Daejeon, all of Rep. of Korea

[73] Assignees: Electronics and Telecommunications Research Institute, Daejeon; Korea Telecom, Seoul, both of Rep. of Korea

[21] Appl. No.: 08/986,267

[22] Filed: Dec. 5, 1997

[30] Foreign Application Priority Data

May 16, 1997 [KR] Rep. of Korea ............. 97-19034

[51] Int. Cl.[7] .................................................. H04J 14/02
[52] U.S. Cl. .................. 359/124; 359/133; 359/187; 372/23; 372/29
[58] Field of Search .................... 359/124, 133, 359/187, 123; 372/23, 29, 33

[56] References Cited

U.S. PATENT DOCUMENTS 5,673,129 9/1997 Mizrahi ........................... 359/124
5,917,625 6/1999 Ogusu et al. .................... 359/130

FOREIGN PATENT DOCUMENTS 0703 679 A2 3/1996 European Pat. Off. ........ H04B 10/14

OTHER PUBLICATIONS

"A Monolithic Multiplexed 16–Wavelenth WDM Transmitter With Accurate Channel Spacing", C.R. Doerr, C. H. Joyner, M. Zirnigibl, R. Monnard, and L. W. Stulz, *Bell Laboratories, Lucent Technologies*, p. PD12–2 to PD12–5.

*Primary Examiner*—Jason Chan
*Assistant Examiner*—Vu T. Lieu
*Attorney, Agent, or Firm*—Cohen, Pontani, Lieberman & Pavane

[57] ABSTRACT

A wavelength aligning apparatus using an arrayed waveguide grating (AWG), and particularly, to a wavelength aligning apparatus using an arrayed waveguide grating which is capable of aligning optical sources using a transmission characteristic of an arrayed waveguide grating in a wavelength alignment method. The apparatus includes a signal generator for applying a signal spaced-apart at a predetermined interval near a predetermined frequency to a bias current of the light source and dithering a central wavelength of each light source, an arrayed waveguide grating for providing a reference wavelength causing a variation difference from the central portion due to a dithering of the central wavelength, a temperature controller for determining a reference wave length by constantly maintaining a temperature of the arrayed waveguide grating, an optical fiber coupler disposed in an output terminal of the arrayed waveguide grating for dividing the signal into a transmission signal and an incoming signal, a plurality of locking amplifiers and a proportional/integration/differentiating unit for computing a bias current corresponding to the detected error signal, and a superposing unit for superposing the computed bias current and a signal from the signal generator for output to the laser diode driver.

3 Claims, 2 Drawing Sheets

WAVELENGTH ALIGNING APPARATUS USING ARRAYED WAVEGUIDE GRATING

BACKGROUND OF THE INVENTION

1. Field of the Invention

The present invention relates to a wave length aligning apparatus using an arrayed waveguide grating (AWG), and particularly, to a wavelength aligning apparatus using an arrayed waveguide grating which is capable of aligning optical sources using a transmission characteristic of an arrayed waveguide grating in a wave length alignment method which is capable of maintaining a compatibility between multiple channel optical transmission systems by equally and differently aligning wavelengths in order to prevent a crosstalk caused due to an optical fiber four wave mixing effect in a wavelength splitting multiple channel optical transmission system.

2. Description of the Conventional Art

Conventionally, an optical frequency (or wavelength) splitting multiple transmission method in which the channels having different optical frequencies (or wavelengths) are combined and transmitted through one optical fiber transmission line is directed to extracting a desired channel wavelength using an optical filter which is capable of recognizing a wavelength by the channel and an optical fiber grating in a side where a predetermined signal is received by an optical signal transmission technique which is capable of expanding a transmission capacity.

There are known two methods for binding the wavelengths of signal channels in the conventional art.

The first method is directed to differently aligning channel intervals in order to reduce noise due to a four wave mixing (FWM) effect between channels.

The second method is directed to setting the channels at even intervals for enabling a compatibility of the system and simplifying the construction thereof.

In the first method, since it is difficult to obtain a desired effect of channel intervals, a predetermined technique is additionally needed for obtaining a compatibility between systems.

In the second method, if an intensity of light is strong, and the phases are matched, the performance of the system is decreased due to noise which is caused by the four wave mixing effects.

Here, the four wave mixing effect denotes that a new wavelength light corresponding to the difference between two wavelengths is generated when a light intensity is increased by a non-linear characteristic of an optical fiber, and the phases are matched at the time of transmitting various wavelengths using one optical fiber.

If a newly generated wavelength light is matched with the light having a predetermined wave length value, thus causing a distortion of a signal wave form, the above-described four wave mixing effects are increased when the wavelength intervals between channels are equivalently spaced-apart.

SUMMARY OF THE INVENTION

Accordingly, it is an object of the present invention to provide a wavelength aligning apparatus using an arrayed waveguide grating which overcomes the aforementioned problems encountered in the conventional art.

It is another object of the present invention to provide a wavelength aligning apparatus using an arrayed waveguide grating which is capable of aligning optical sources using a transmission characteristic of an arrayed waveguide grating in a wavelength alignment method which is capable of maintaining a compatibility between multiple channel optical transmission systems by equally and differently aligning wavelengths in order to prevent a crosstalk caused due to an optical fiber four wave mixing effect in a wavelength splitting multiple channel optical transmission system.

It is another object of the present invention to provide a wavelength aligning apparatus using an arrayed waveguide grating which is capable of using an arrayed waveguide grating which is fabricated by a mask pattern formed to have an equal interval (different interval) characteristic of a wavelength alignment in a multiple channel optical transmission system using an arrayed waveguide grating in a dithering method and aligning an optical source by matching with respect to transmission reference wavelengths from an arrayed waveguide grating by dithering a central wavelength of each optical source.

It is another object of the present invention to provide a wavelength aligning apparatus using an arrayed waveguide grating which is capable of preventing a crosstalk problem which is caused due to a four wave mixing effect by differently setting the channels.

It is another object of the present invention to provide a wavelength aligning apparatus using an arrayed waveguide grating which is capable of having a good compatibility of a channel between multiple channel optical transmission systems using the identical arrayed waveguide grating using the same mask in an arrayed waveguide path used in a multiple channel optical system.

To achieve the above objects, there is provided an improved wavelength aligning apparatus using an arrayed waveguide grating which includes a plurality of laser diode drivers (light source drivers) for controlling a central wavelength of each light source, a plurality of light sources for generating lights in accordance with controls of the laser diode drivers, a signal generator for applying a signal spaced-apart at a predetermined interval near a predetermined frequency to a vias current of the light source and dithering a central wavelength of each light source, an arrayed waveguide grating for providing a reference wavelength causing a variation difference from the central portion due to a dithering of the central wavelength, a temperature controller for determining a reference wave length by constantly maintaining a temperature of the arrayed waveguide grating, an optical fiber coupler disposed in an output terminal of the arrayed waveguide grating for dividing the signal into a transmission signal and an incoming signal, a plurality of locking amplifiers and a proportional/integration/differentiating unit for computing a bias current corresponding to the detected error signal, and a superposing unit for superposing the computed bias current and a signal from the signal generator and outputting the thusly superposed signal to the laser diode drivers, respectively.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
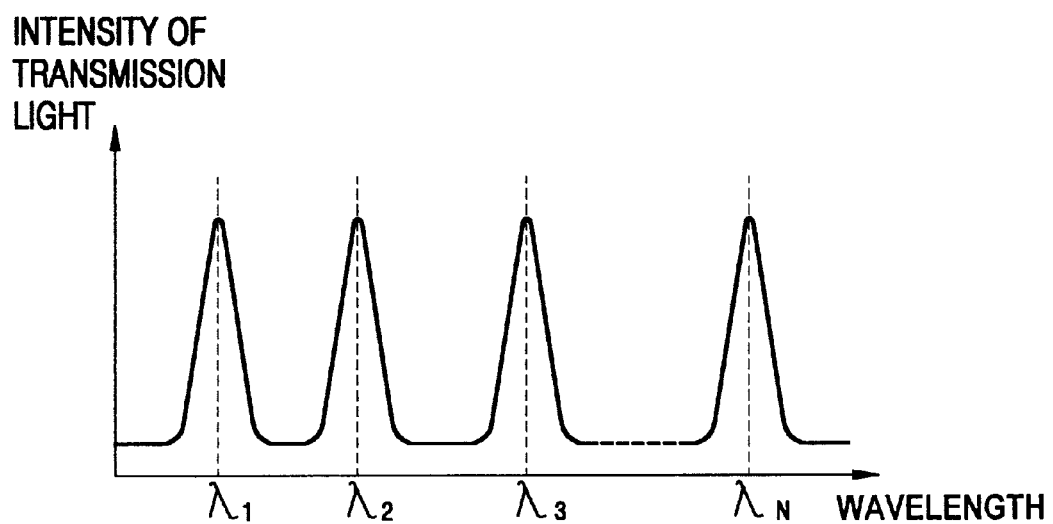
FIG. 1 is a graph illustrating a transmission characteristic of an arrayed waveguide grating according to the present invention.

FIG. 1 illustrates a transmission characteristic of an arrayed waveguide grating (AWG) according to the present invention.

Namely, FIG. 1 illustrates a transmission characteristic of a light passed through an arrayed waveguide grating formed on a silicon substrate, and in more detail illustrates a spectrum of a light passed through an arrayed waveguide grating and having a continuous spectrum.

Therefore, the light having a corresponding wavelength is transmitted in accordance with a spectrum of the light.

The alignment of the central wavelength of each optical source is enabled by aligning to the maximum value wavelength of a transmission characteristic of an arrayed waveguide grating.

At this time, in view of the maximum transmission wavelength, the arrayed waveguide grating is designed to have a different interval characteristic based on the four wave mixing effects, so that it is possible to reduce the four wave mixing effects which are obtained when the aligned lights are transmitted through an optical fiber.

Figure 2:
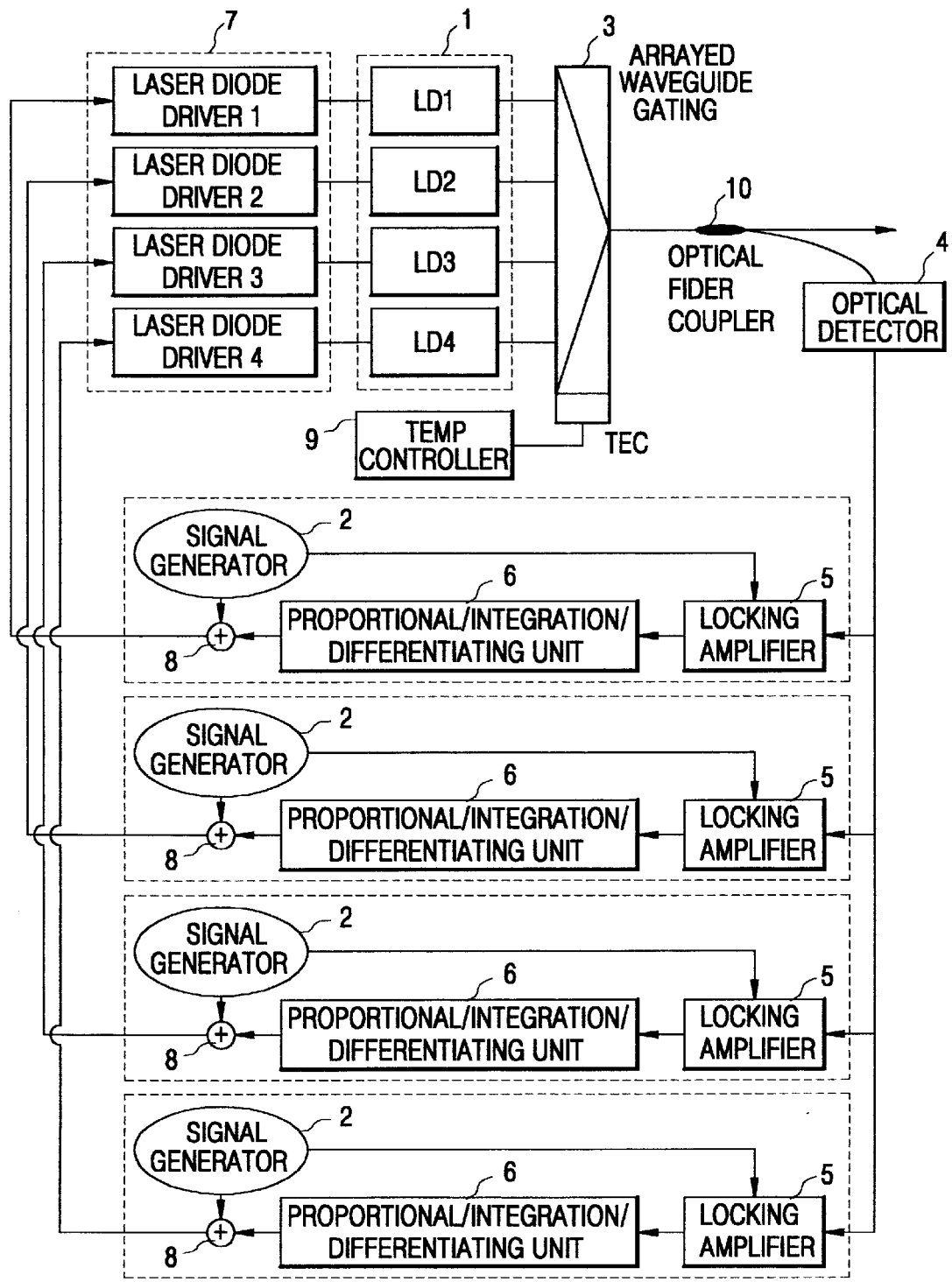
FIG. 2 is a block diagram illustrating a wavelength aligning apparatus for a multichannel light source using an arrayed waveguide grating according to the present invention.

FIG. 2 illustrates a block diagram of a wavelength alignment of multiple channel optical sources using an arrayed waveguide grating according to the present invention.

The wavelength aligning apparatus using an arrayed waveguide grating according to the present invention includes a plurality of laser diode drivers (light source drivers) 7 for controlling a central wavelength of each optical source until an error signal becomes 0, a light source 1 for generating lights in accordance with a control of the laser diode driver 7, a signal generator (oscillator) 2 for applying signals each having a predetermined value which is different from a predetermined frequency interval near a predetermined frequency to a bias current of a light source for dithering the central wavelength of each light source, an arrayed wave guide grating 3 for generating a reference wavelength which causes a variation difference from the central portion near the maximum transmission wavelength points due to the dithering of the central wavelengths, a temperature controller 9 for constantly controlling a temperature of an arrayed waveguide grating and determining a reference wavelength, an optical fiber coupler 10 disposed in an output terminal of the arrayed waveguide grating 3 for dividing the signal into a transmission signal and an incoming signal, an optical detector 4 for receiving an incoming signal and detecting an error signal, a plurality of locking amplifiers 5 for computing bias currents corresponding to the thusly detected error signal, a proportional/integration/differentiating unit 6, and a plurality of superposing (summings) units 8 for superposing the computed bias current and the signal from the signal generator and outputting the thusly superposed signals to the laser diode driver.

The operation of the wavelength aligning apparatus using an arrayed waveguide grating according to the present invention will now be explained with reference to the accompanying drawing.

In the present invention, the central wavelengths of each light source are aligned in a portion of the maximum transmission wave length of the arrayed waveguide grating.

In addition, in the wavelength splitting multiple channel optical transmission system, a dithering method which is one of channel locking methods which is generally used in the wavelength splitting multiple channel optical transmission system is used.

The signals having a predetermined value spaced part from a few tens of KHz and a few hundreds of Hz are applied to the bias current of the light source 1 through the signal generator 2, thus dithering the central wavelengths of each light source.

The dithering of the central wavelength is reciprocately performed near the maximum transmission wavelength portion of the arrayed waveguide grating 3 which provides a reference wavelength. If the dithering operation is performed in the other portion thereof, the variation difference is made spaced-apart from the position of the reference wavelength, so that an error signal corresponding thereof is generated.

In addition, in a state that the temperature of the arrayed waveguide grating 3 is made constant, the reference transmission wavelength is determined by the temperature controller 9.

The signal is divided by the optical fiber coupler 10 disposed in the output terminal of the arrayed waveguide grating 3. One of the thusly divided signals is transmitted, and the other signal is made incident into the optical detector 4, thus detecting an error signal.

The thusly detected signal is outputted as a bias current corresponding to the error signal through the plurality of the locking amplifiers 5 and the proportional/integration/differentiating unit 6 and is superposed with the signal from the signal generator 2 by the superposing unit 8 and is inputted into a corresponding laser diode driver 7 and is used for controlling the central wavelength of the light source 1.

The above-described operations are performed until the error signal which is generated by each light source becomes 0.

Namely, the above-described operations are performed until the central wavelength of the light source is accurately matched with the reference wavelength which is passed by the arrayed waveguide grating.

Therefore, the light source 1 is aligned on the maximum transmission wavelength portion of the arrayed waveguide grating 3 which is designed at a different interval (equivalent interval).

As described above, in the present invention, it is possible to stably aligning the wavelength of light source with respect to the reference wavelengths of the arrayed waveguide grating, using an arrayed waveguide grating having the same characteristic as a demultiplexer, maintaining a compatibility between multiple channel optical transmission systems which are capable of separating/extracting the channels without additionally using a control function. In addition, it is possible to prevent a crosstalk due to a four wave mixing effect by differently forming the reference wave length from the arrayed waveguide grating.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A wavelength aligning apparatus for aligning a wavelength of a light source in a multiple channel optical transmission system using a wave splitting multiple transmission technique, comprising:

a plurality of light sources each having a central wavelength;

a plurality of laser diode drivers for controlling the central wavelength of each of said light sources for generating lights in accordance with controls of said laser diode drivers;

a plurality of signal generators for applying a signal spaced-apart at a predetermined interval near a predetermined frequency to a bias current of the plurality of said light sources and dithering the central wavelengths of each of said light sources;

an arrayed waveguide grating connected to each of said light sources;

a temperature controller connected to said arrayed waveguide grating;

an optical fiber coupler disposed in an output terminal of the arrayed waveguide grating for dividing a difference signal from said arrayed waveguide grating into a transmission signal and an incoming signal;

a plurality of locking amplifiers connected so as to receive the income signal from said optical fiber coupler;

a plurality of proportional/integration/differentiating units, each of said proportional/integration/differentiating units being connected to each of said locking amplifiers; and a plurality of superposing units connected to said signal generators, said proportional/integration/differentiating units, and said laser diode drivers;

wherein said arrayed waveguide grating causes a variation difference signal between a reference wavelength and the dithering of the central wavelength;

said temperature controller maintains a temperature of said arrayed waveguide grating constant in order to determine the reference wavelength;

each of said locking amplifiers and a corresponding one of said proportional/integration/differentiating units compute a bias current corresponding to the incoming signal; and each of said superposing units superposes the bias current and a signal from an associated one of said signal generators and outputs a superposed signal to a corresponding one of said laser diode drivers.

2. The apparatus of claim 1, wherein said laser diode drivers are repeatedly controlled until the incoming signal becomes 0.

3. The apparatus of claim 1, wherein said arrayed waveguide grating is configured so that the intervals between reference wavelengths are equal to each other in order to reduce crosstalk between channels due to a four wave mixing effect.

* * * * *